(12) United States Patent
Fang

(10) Patent No.: US 7,990,712 B2
(45) Date of Patent: Aug. 2, 2011

(54) HEAT SINK USED IN INTERFACE CARD

(75) Inventor: Yuan-Cheng Fang, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 207 days.

(21) Appl. No.: 12/347,035

(22) Filed: Dec. 31, 2008

(65) Prior Publication Data

US 2010/0165573 A1   Jul. 1, 2010

(51) Int. Cl.
*H05K 7/20* (2006.01)
*F28F 7/00* (2006.01)
*H01L 23/34* (2006.01)

(52) U.S. Cl. ... 361/700; 361/699; 361/715; 361/679.52; 361/679.47; 165/80.4; 165/104.33; 174/15.2; 257/715; 257/E23.088

(58) Field of Classification Search ............ 361/699, 361/700, 715, 679.52; 165/80.4, 80.5, 104.33; 174/15.2; 257/714–715, E23.088

See application file for complete search history.

(56) References Cited

U.S. PATENT DOCUMENTS

| | | | |
|---|---|---|---|
| 6,671,177 B1 * | 12/2003 | Han | 361/719 |
| 7,327,576 B2 * | 2/2008 | Lee et al. | 361/719 |
| 7,369,412 B2 * | 5/2008 | Peng et al. | 361/715 |
| 7,492,596 B1 * | 2/2009 | Peng et al. | 361/700 |
| 7,495,920 B2 * | 2/2009 | Chen et al. | 361/719 |
| 7,755,902 B2 * | 7/2010 | Peng et al. | 361/719 |
| 2006/0164808 A1 * | 7/2006 | Stefanoski | 361/700 |
| 2007/0171611 A1 * | 7/2007 | Peng et al. | 361/695 |
| 2009/0194260 A1 * | 8/2009 | Liao et al. | 165/104.33 |

* cited by examiner

*Primary Examiner* — Zachary M Pape
(74) *Attorney, Agent, or Firm* — Chun-Ming Shih; HDLS IPR Services

(57) ABSTRACT

A heat sink used in an interface card includes a supporting base, a first heat-dissipating body and a second heat-dissipating body. The supporting base has a side. The first heat-dissipating body is mounted on the supporting base. The first heat-dissipating body is constituted of a plurality of overlapping heat-dissipating pieces. The heat-dissipating pieces are arranged obliquely with respect to the side. The second heat-dissipating body overlaps on the first heat-dissipating body. The second heat-dissipating body comprises a plurality of heat-dissipating pieces. Via the above arrangement, the heat-dissipating efficiency of the interface card can be increased and the lifetime thereof can be extended.

12 Claims, 8 Drawing Sheets

HEAT SINK USED IN INTERFACE CARD

BACKGROUND OF THE INVENTION

1. Field of the Invention

The present invention relates to a heat sink, and in particular to a heat sink used in an interface card.

2. Description of Prior Art

Heat sink is usually mounted on an interface card in order to dissipate a great amount of heat generated by the operation of the interface card. In this way, the temperature of the interface card can be lowered, thereby allowing the interface card to be operated in a space with lower temperature and avoiding the breakdown or damage of the interface card due to its excessive heat.

The conventional heat sink used in an interface card includes a supporting base, a heat-dissipating piece assembly and a fan. The interface card has a fixing piece. The heat-dissipating piece assembly is mounted on the supporting base and is constituted of a plurality of overlapping heat-dissipating pieces. The heat-dissipating pieces are arranged transversely to correspond to the fixing piece. The fan is mounted on the supporting base and is located beside the heat-dissipating piece assembly. Via this arrangement, a heat sink can be obtained.

However, in practice, the conventional interface card used in an interface card still has drawbacks as follows. Since the heat-dissipating pieces are arranged transversely to correspond to the fixing piece, the airflow will be blocked by the fixing piece when the fan dissipates the heat of the heat-dissipating pieces, which affects the heat-dissipating efficiency adversely and in turn reduces the lifetime of the interface card.

In view of the above, the inventor contemplates the foregoing drawbacks, employs related principles and thus provides a feasible design to efficiently improve the above drawbacks.

SUMMARY OF THE INVENTION

The present invention is to provide a heat sink used in an interface card, in which a fan is used to dissipate the heat of a first heat-dissipating body of a plurality of heat-dissipating pieces that are arranged obliquely, so that the waste heat generated by the operation of the interface card can be carried away. Via this arrangement, the heat-dissipating efficiency of the interface card can be increased and the lifetime thereof can be extended.

The present invention is to provide a heat sink used in an interface card, in which a second heat-dissipating body overlaps on the first heat-dissipating body to improve the heat-dissipating efficiency of the interface card and extend its lifetime.

The present invention provides a heat sink used in an interface card, which includes a supporting base, a first heat-dissipating body and a second heat-dissipating body. The supporting base has a side. The first heat-dissipating body is mounted on the supporting base. The first heat-dissipating body is constituted of a plurality of overlapping heat-dissipating pieces. The heat-dissipating pieces are arranged obliquely with respect to the side. The second heat-dissipating body overlaps on the first heat-dissipating body. The second heat-dissipating body comprises a plurality of heat-dissipating pieces.

The present invention provides a heat sink used in an interface card, which includes a supporting base, a first heat-dissipating body, a second heat-dissipating body and at least one heat pipe. The supporting base has a side. The first heat-dissipating body is mounted on the supporting base. The first heat-dissipating body is constituted of a plurality of overlapping heat-dissipating pieces. The heat-dissipating pieces are arranged obliquely with respect to the side. The second heat-dissipating body overlaps on the first heat-dissipating body. The second heat-dissipating body comprises a plurality of heat-dissipating pieces. The heat pipe has an evaporator section sandwiched between the supporting base and the first heat-dissipating body and a condenser section extending from the evaporator section to connect to the second heat-dissipating body.

The present invention provides a heat sink used in an interface card, in which the evaporator section of the heat pipe is sandwiched between the first heat-dissipating body and the supporting base, and the condenser section thereof is connected to the second heat-dissipating body, thereby further increasing the heat-dissipating efficiency of the interface card.

The present invention provides a heat sink used in an interface card, in which a heat-conducting pipe is sandwiched between the first heat-dissipating body and the supporting base, thereby increasing the heat-dissipating efficiency of the interface card.

DETAILED DESCRIPTION OF THE INVENTION

The characteristics and technical contents of the present invention will be explained in detail with reference to the accompanying drawings. However, it should be noted that the drawings are illustrative only but not to limit the scope of the present invention.

Figure 1:
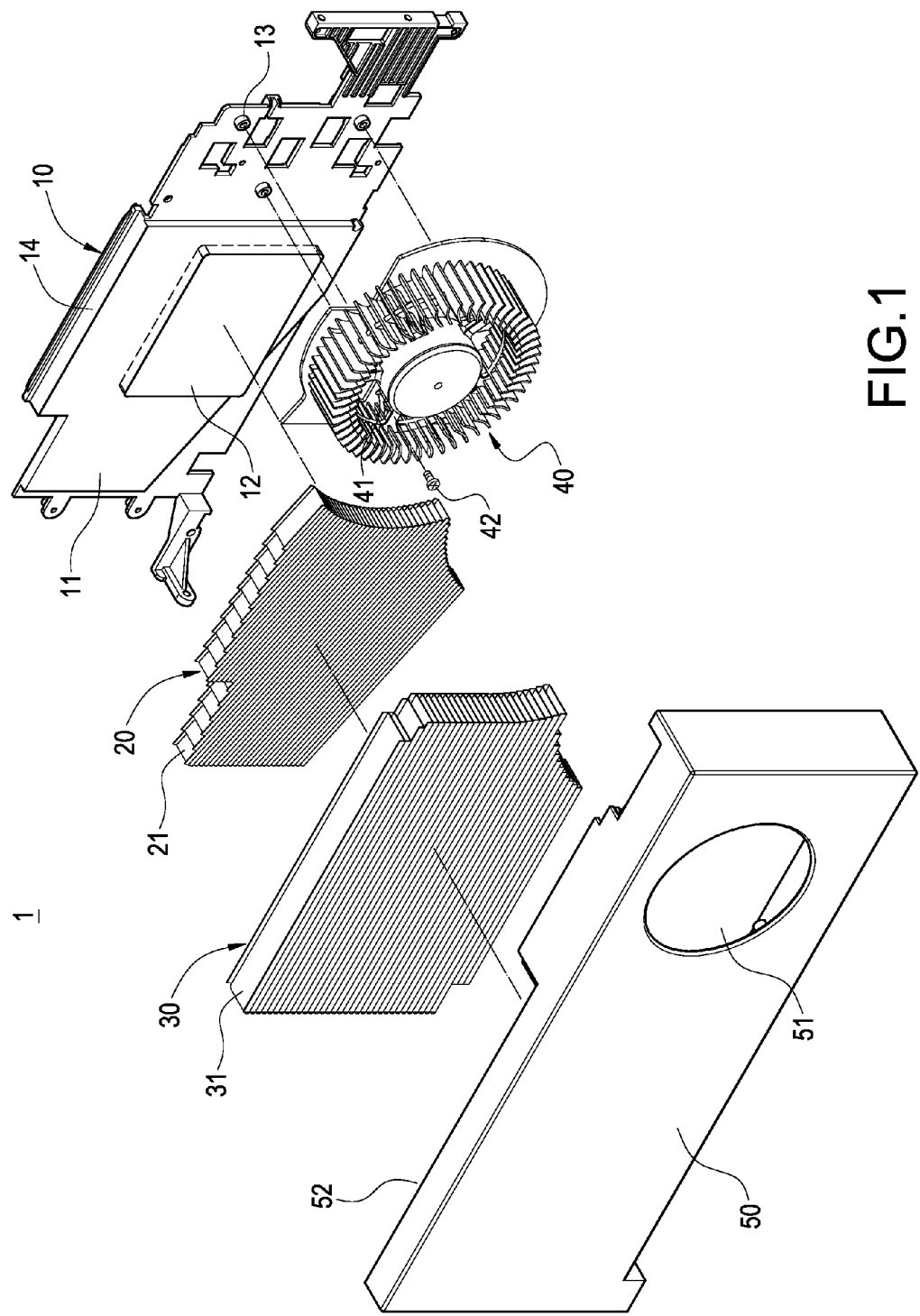
FIG. 1 is an exploded perspective view of the present invention.
Figure 2:
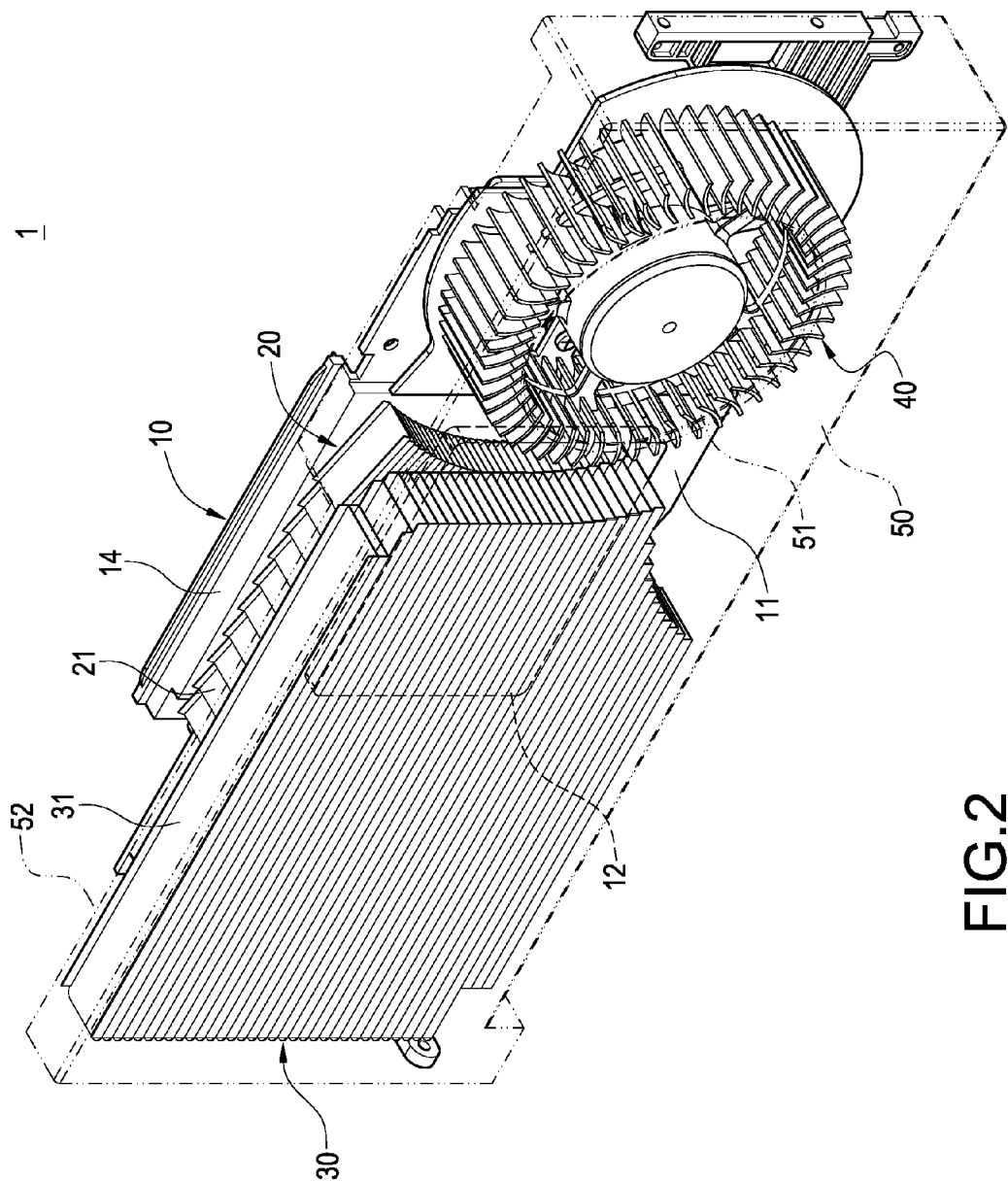
FIG. 2 is an assembled perspective view of the present invention.

Please refer to FIGS. 1 and 2. According to the present invention, the heat sink 1 used in an interface card is constituted of a supporting base 10, a first heat-dissipating body 20 and a second heat-dissipating body 30.

The supporting base 10 comprises a fixing plate 11, a heat-conducting block 12 fixedly inserted into the fixing plate 11, and at least one bolt 13 protruding from the fixing plate 11. The fixing plate 11 has a side 14. The heat-conducting block 12 is a rectangular heat-conducting block 12 and its outer surface may be in flush with the surface of the fixing plate 11. The heat-conducting block 12 is a copper block or an aluminum block, but it is not limited thereto.

The first heat-dissipating body 20 is mounted to the supporting base 10 and is adhered to the surface of the heat-conducting block 12. The first heat-dissipating body 20 is constituted of a plurality of heat-dissipating pieces 21. The heat-dissipating pieces 21 are arranged obliquely with respect to the side 14.

The second heat-dissipating body 30 overlaps on the first heat-dissipating body 20. The second heat-dissipating body 30 comprises a plurality of heat-dissipating pieces 31. The heat-dissipating pieces 31 are arranged to be parallel to the side.

In the present embodiment, a fan 40 is further provided. The fan 40 is mounted to the supporting base 10 and is located beside the first heat-dissipating body 20 and the second heat-dissipating body 30. The fan 40 is provided with at least one through-hole 41. The through-hole 41 is arranged to correspond to the bolt 13 of the supporting base 10. At least one screw 42 passes through the through-hole 41 and is threadedly connected to the bolt 13. The fan 40 may be a centrifugal fan or an axial fan, but it is not limited thereto.

In the present embodiment, a wind cover 50 may be further connected to the supporting base 10. The wind cover 50 covers the first heat-dissipating body 20, the second heat-dissipating body 30 and the fan 40. The wind cover 50 is provided with an intake port 51 corresponding to the fan 40 and an exit port 52 on one side of the wind cover 50.

Figure 3:
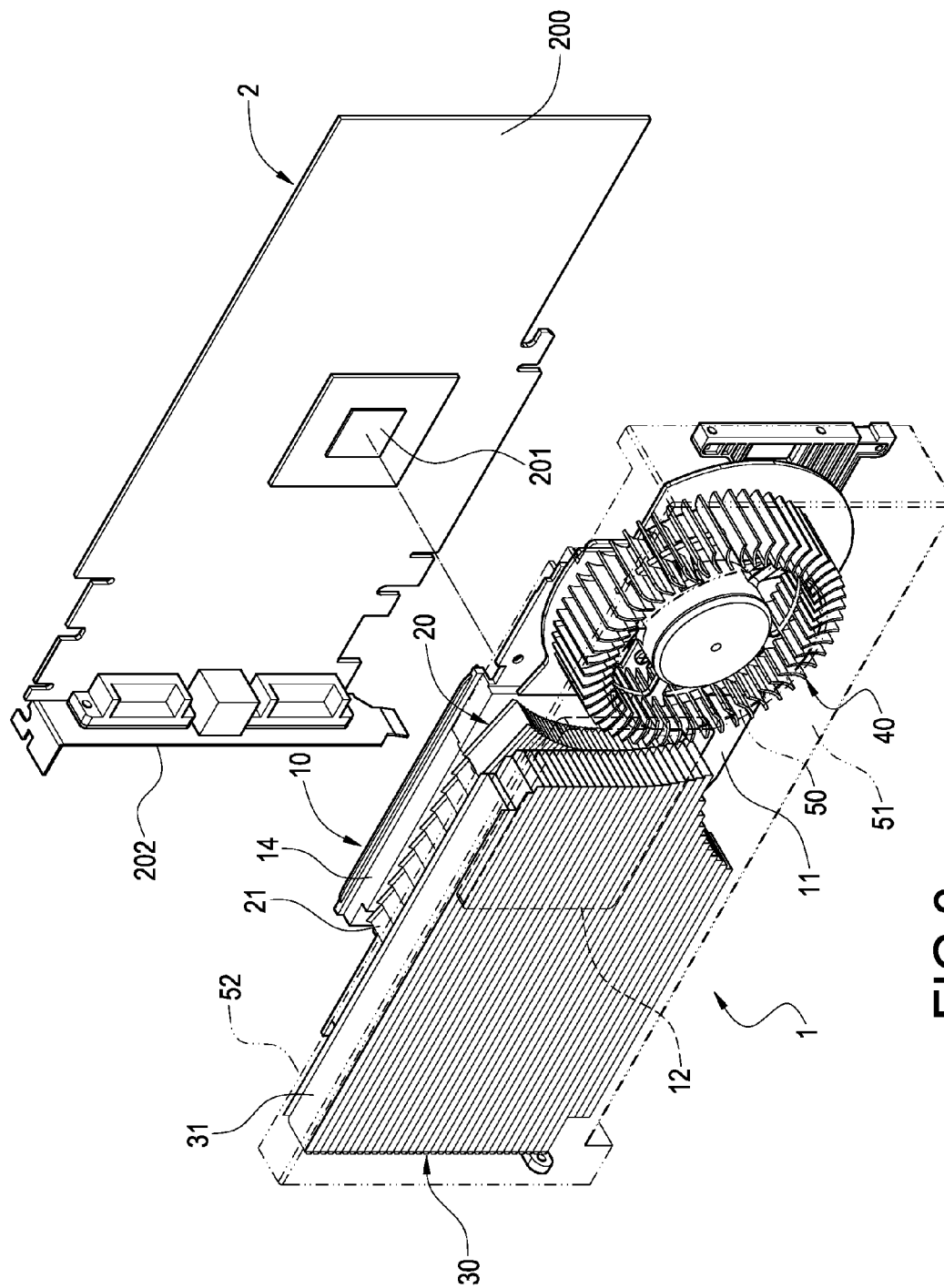
FIG. 3 is a perspective view showing the present invention being applied to an interface card.
Figure 4:
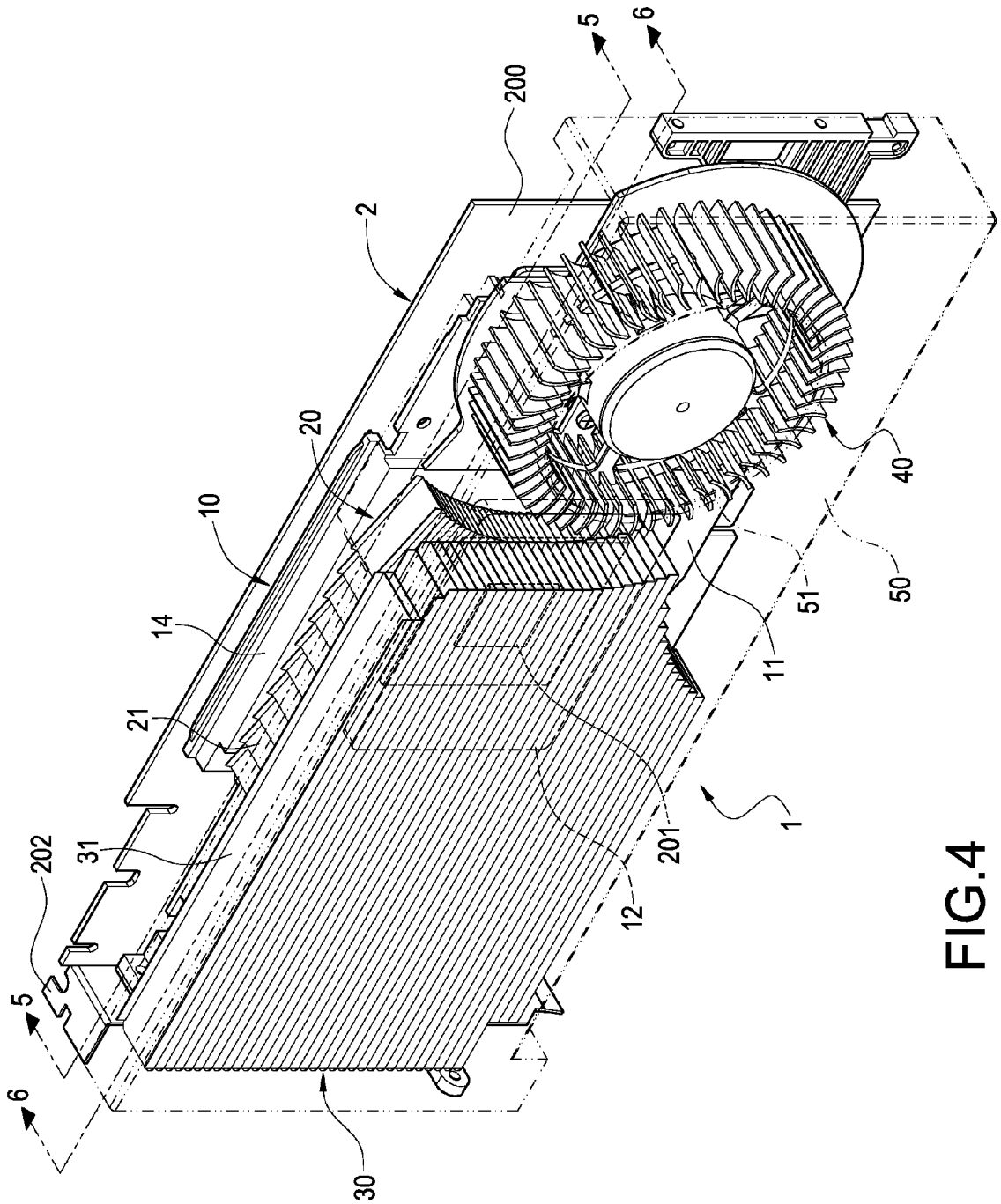
FIG. 4 is an assembled view of FIG. 3.

When the present invention is applied to an interface card 2 as shown in FIG. 3, the interface card 2 has a circuit board 200, a heat-generating element 201 provided on the surface of the circuit board 200 and a fixing piece 202 provided on one end of the circuit board 200. The heat-conducting block 12 of the heat sink 1 of the present invention is adhered to the heat-generating element 201 (FIG. 4). The interface card 2 may be a display card, a sound effect card, a graphic card, an Ethernet card or the like, but it is not limited thereto.

Figure 5:
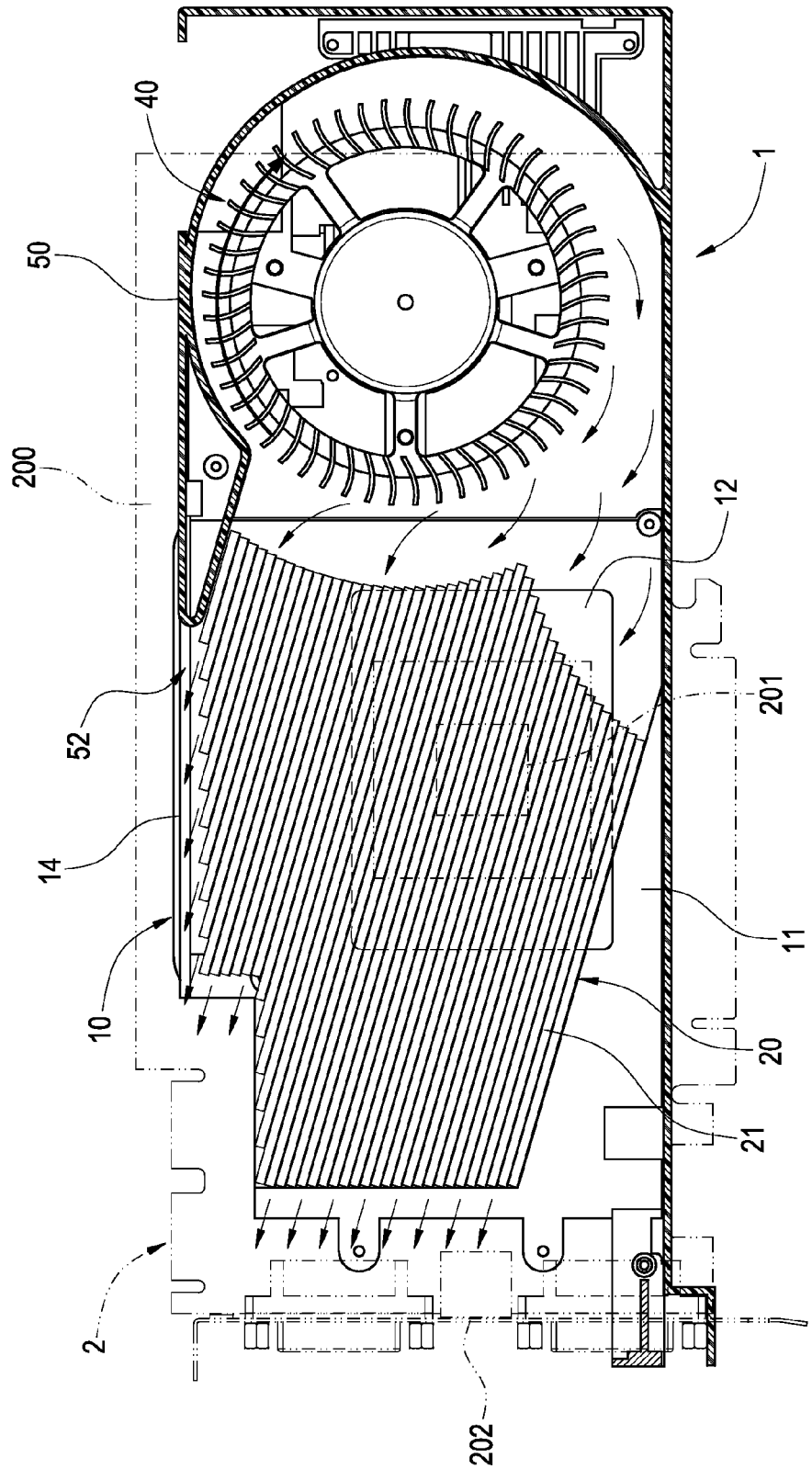
FIG. 5 is cross-sectional view taken along the line 5-5 in FIG. 4.
Figure 6:
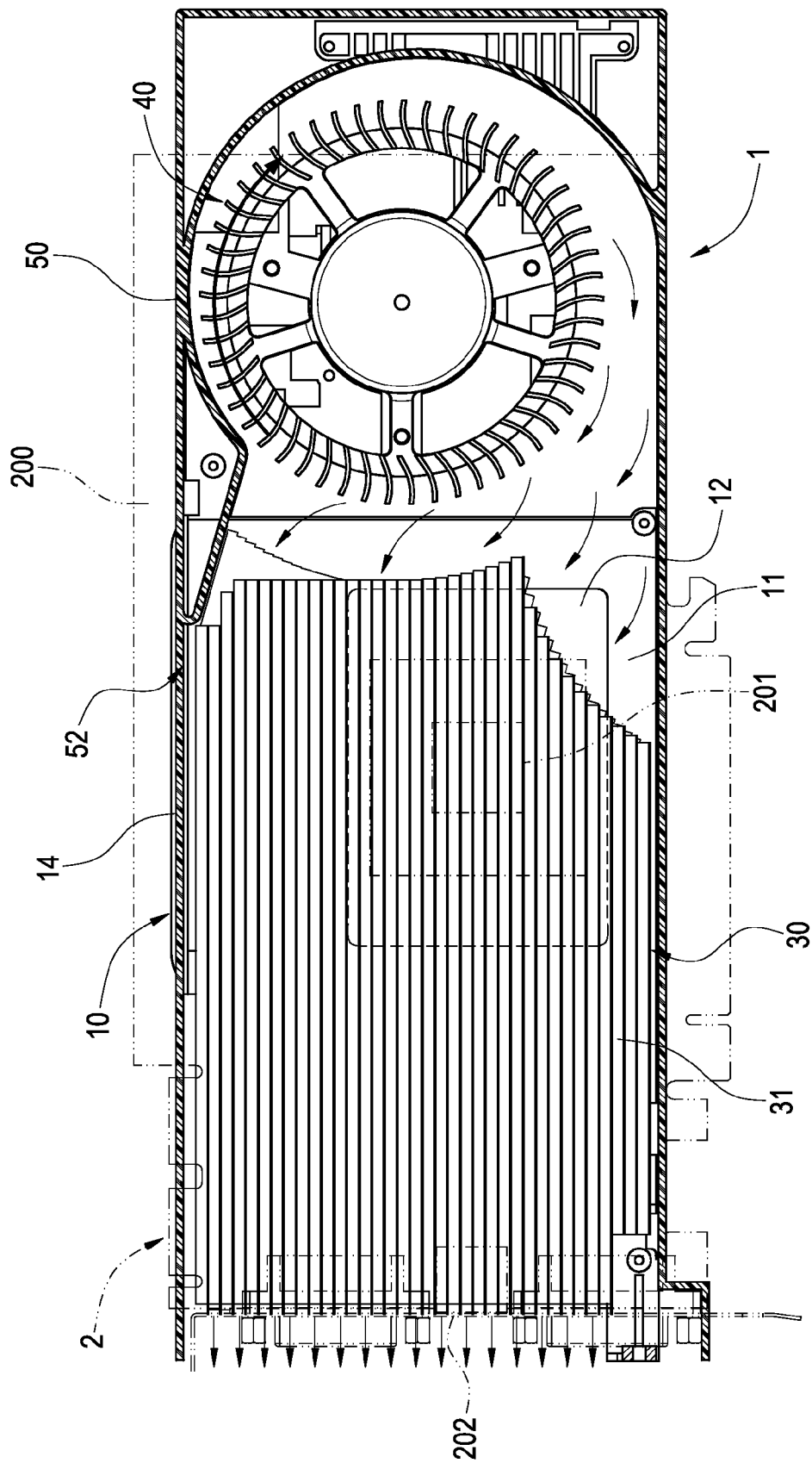
FIG. 6 is cross-sectional view taken along the line 6-6 in FIG. 4.

Please refer to FIGS. 5 and 6. When the interface card 2 is operated, the high heat generated by the heat-generating element 201 is transferred to the heat-conducting block 12, and then is dissipated by the first heat-dissipating body 20, the second heat-dissipating body 30 and the fan 40. In FIG. 5, the airflow generated by the fan 40 passes through the first heat-dissipating body 20 and is guided to the exit port 52 of one side of the wind cover 50 to flow outside. Thus, the airflow will not be blocked by the fixing piece 202 of the interface card 2, so that the high heat generated by the interface card 2 can be carried away. In FIG. 6, after the airflow generated by the fan 40 passes through the second heat-dissipating body 30, since the second heat-dissipating body 30 is located at a higher level, the airflow will not be blocked by the fixing piece 202 of the interface card 2, so that the high heat generated by the interface card 2 can be dissipated. Therefore, the present invention increases the heat-dissipating efficiency and extends the lifetime thereof efficiently.

Figure 7:
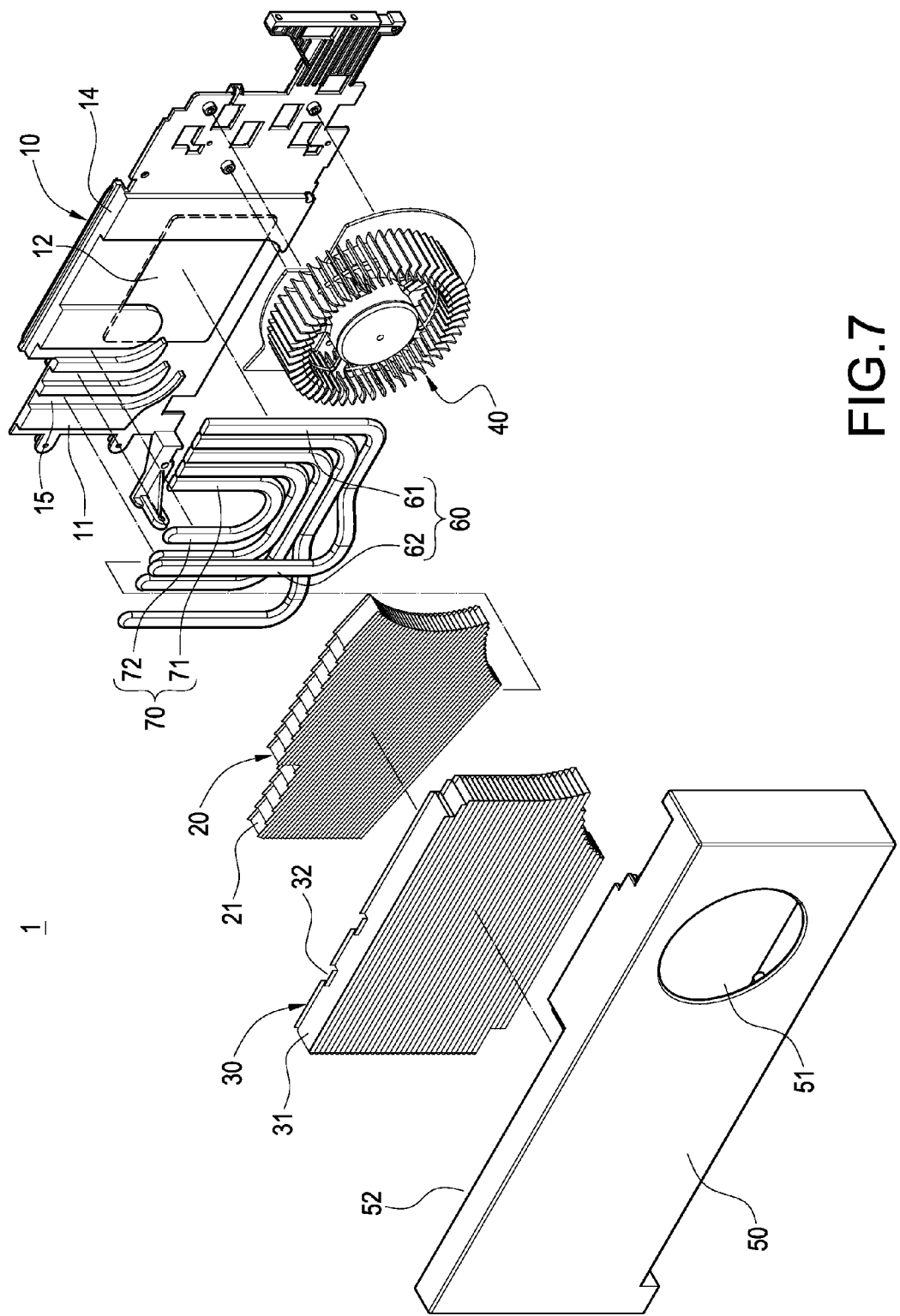
FIG. 7 is a schematic view showing another embodiment of the present invention.
Figure 8:
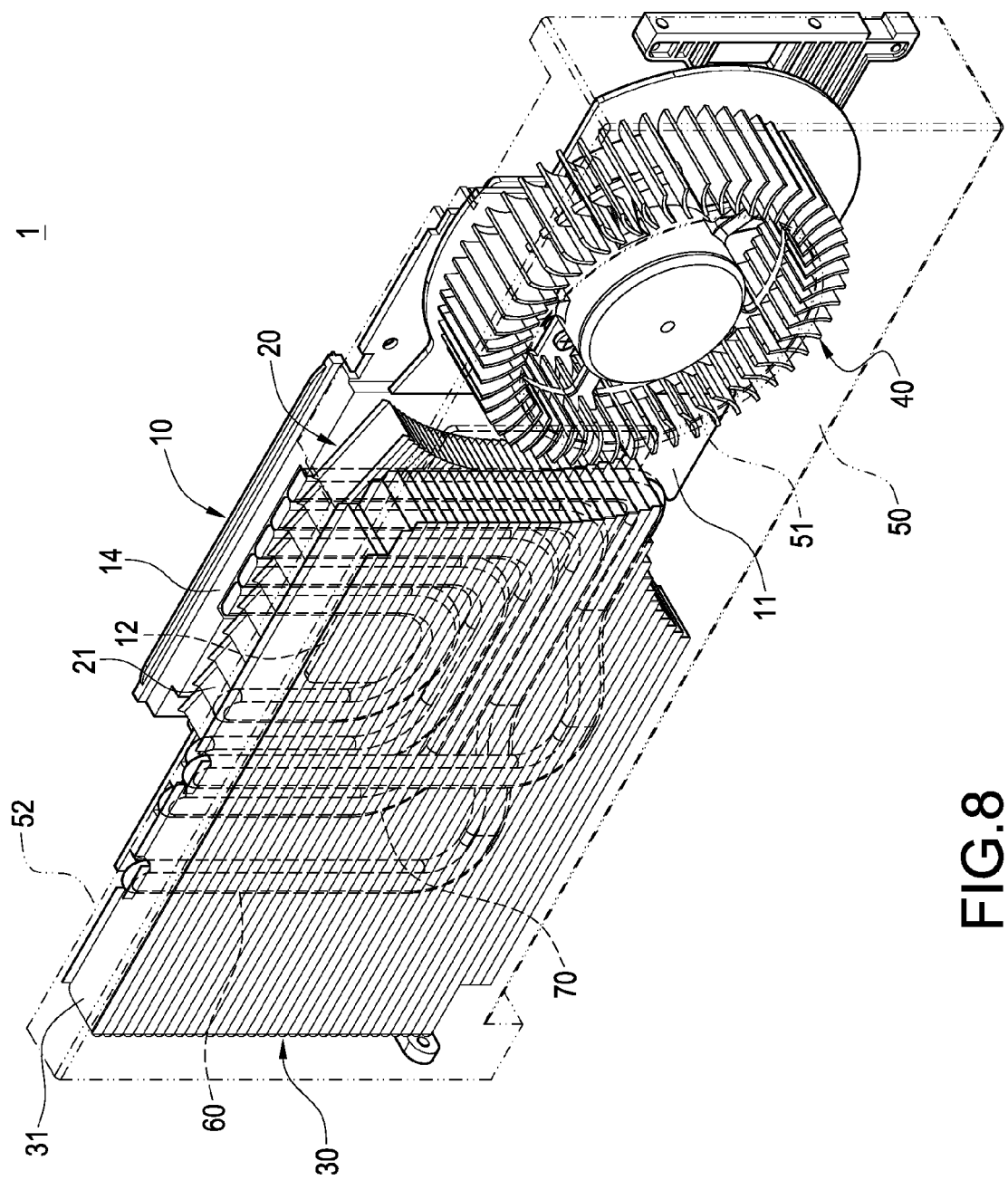
FIG. 8 is an assembled view of FIG. 7.

Please refer to FIGS. 7 and 8, which show another embodiment of the present invention. The difference between the present embodiment and the previous embodiment lies in that the present embodiment further includes at least one heat pipe 60. The second heat-dissipating body 30 is provided with a trough 32. The heat pipe 60 can be a U-shaped heat pipe with a rectangular cross section. The heat pipe 60 has an evaporator section 61 sandwiched between the supporting base 10 and the first heat-dissipating body 20 and adhered to the heat-conducting block 12, as well as a condenser section 62 extending from the evaporator section 61 and connected into the trough 32. Via the above arrangement, the heat-dissipating efficiency of the interface card 2 can be further improved.

In the previous embodiment, at least one heat-conducting pipe 70 can be provided. The fixing plate 11 is provided with a trough 15. The heat-conducting pipe 70 can be a U-shaped heat pipe with a rectangular cross section. The heat-conducting pipe 70 has a heated section 71 sandwiched between the supporting base 10 and the first heat-dissipating body 20 and adhered to the heat-conducting block 12, as well as a heat-releasing section 72 extending from the heated section 71 and inserted into the trough 15. Via the above arrangement, the heat-dissipating efficiency of the interface card 2 can be further improved.

According to the above, the present invention really improves the heat-dissipating efficiency of an interface card 2 and extends its lifetime efficiently. Therefore, the present invention can solve the drawbacks of prior art and indeed has industrial applicability.

What is claimed is:

1. A heat sink used in an interface card, comprising:
a supporting base having a side;
a first heat-dissipating body mounted on the supporting base, the first heat-dissipating body being constituted of a plurality of heat-dissipating pieces, each heat-dissipating piece being arranged obliquely with respect to the side, whereby air passing through the first heat dissipating body exits the first heat dissipating body at an oblique angle with respect to the side;
a second heat-dissipating body overlapping on the first heat-dissipating body, the second heat-dissipating body comprising a plurality of heat-dissipating pieces;
at least one heat pipe having an evaporator section sandwiched between the supporting base and the first heat-dissipating body as well as a condenser section extending from the evaporator section and connected to the second heat-dissipating body;
a fan mounted to the supporting base and located beside the first heat-dissipating body and the second heat-dissipating body; and
at least one heat-conducting pipe having a heated section sandwiched between the supporting base and the first heat-dissipating body as well as a heat-releasing section,
wherein the supporting base comprises a fixing plate and a heat-conducting block fixedly inserted into the fixing plate, and
wherein the fixing plate is provided with a trough for allowing the heat-releasing section to be inserted therein, and the heated section is adhered to the heat-conducting block.

2. The heat sink used in an interface card according to claim 1, wherein the heat-dissipating pieces of the second heat-dissipating body are arranged to be parallel to the side.

3. The heat sink used in an interface card according to claim 1, wherein the fan is a centrifugal fan or an axial fan.

4. The heat sink used in an interface card according to claim 1, further comprising a wind cover connected to the supporting base, the wind cover covering the first heat-dissipating body, the second heat-dissipating body and the fan.

5. The heat sink used in an interface card according to claim 4, wherein the wind cover is provided with an intake port corresponding to the fan and an exit port provided on one side of the wind cover.

6. The heat sink used in an interface card according to claim 1, wherein the second heat-dissipating body is provided with a trough for allowing the condenser section to be inserted therein, the evaporator section is sandwiched between the first heat-dissipating body and the heat-conducting block.

7. The heat sink used in an interface card according to claim 1, wherein the heat-conducting block is a copper block or an aluminum block.

8. The heat sink used in an interface card according to claim 1, wherein the supporting base further comprises at least one bolt protruding from the fixing plate, the fan is provided with at least one through-hole corresponding to the bolt, at least one screw passes through the through-hole to lock the fan.

9. The heat sink used in an interface card according to claim 1, wherein the heat pipe is a U-shaped heat pipe.

10. The heat sink used in an interface card according to claim 1, wherein the cross section of the heat pipe is rectangular.

11. The heat sink used in an interface card according to claim 1, wherein the heat-conducting pipe is a U-shaped heat pipe.

12. The heat sink used in an interface card according to claim 1, wherein the cross section of the heat-conducting pipe is rectangular.

* * * * *